United States Patent [19]
Simpson

[11] Patent Number: 5,514,242
[45] Date of Patent: May 7, 1996

[54] METHOD OF FORMING A HEAT-SINKED ELECTRONIC COMPONENT

[75] Inventor: Matthew Simpson, Sudbury, Mass.

[73] Assignee: Saint Gobain/Norton Industrial Ceramics Corporation, Worcester, Mass.

[21] Appl. No.: 175,587

[22] Filed: Dec. 30, 1993

[51] Int. Cl.$^6$ .............................. B32B 31/00; H05H 1/48
[52] U.S. Cl. ...................... 156/299; 427/249; 427/255.7; 427/577; 427/580
[58] Field of Search .................. 427/249, 255.7, 427/577, 580; 423/446; 117/929; 156/299

[56] References Cited

U.S. PATENT DOCUMENTS

| | | |
|---|---|---|
| 4,471,003 | 9/1984 | Cann . |
| 4,487,162 | 12/1984 | Cann . |
| 4,707,384 | 11/1987 | Schachner et al. ...................... 427/250 |
| 4,988,421 | 1/1991 | Drawl et al. ........................ 427/255.7 |
| 5,124,179 | 6/1992 | Garg et al. ............................... 427/249 |
| 5,139,372 | 8/1992 | Tanabe et al. . |
| 5,204,144 | 4/1993 | Cann et al. . |
| 5,260,106 | 11/1993 | Kawarada et al. ....................... 427/249 |
| 5,294,381 | 3/1994 | Iguchi et al. ............................ 427/250 |

FOREIGN PATENT DOCUMENTS 63-307196  12/1988  Japan .

OTHER PUBLICATIONS

Abstract (Dialog) From Diamond Film Update of Jun. 16, 1994 —"CVD Diamond Film Without Stress Cracks" (1 sheet) from Surface Modification Technology News May 1994.

Primary Examiner—Roy V. King
Attorney, Agent, or Firm—Volker R. Ulbrich; Martin M. Novack

[57] ABSTRACT

A method for forming a heat-sinked electronic component includes the following steps: depositing, at a first deposition rate, a first layer of synthetic diamond having a relatively high thermal conductivity; depositing, on the first layer, at a second deposition rate that is higher than the first deposition rate, a second layer of synthetic diamond having a relatively low thermal conductivity; and mounting an electronic component on the first layer of synthetic diamond. Alternatively, the layers may be deposited in the opposite order.

17 Claims, 3 Drawing Sheets

METHOD OF FORMING A HEAT-SINKED ELECTRONIC COMPONENT

This invention was made with Government support, and the Government has certain rights in the invention.

FIELD OF THE INVENTION

This invention relates to thermal management of electronic devices and circuits and, more particularly, to heat-sinked electronic components that employ synthetic diamond.

BACKGROUND OF THE INVENTION

The effectiveness of a heat sink is a function of the thermal conductivity of the heat sink material, so materials of high thermal conductivity are preferred for use as heat sinks. Diamond has the highest thermal conductivity of any known material. Silver, copper, and aluminum are among the best cheaper alternative heat sink materials but, in addition to having much lower thermal conductivities than diamond, they are much heavier than diamond, and are not electrical insulators.

Synthetic diamond, such as polycrystalline diamond film made by chemical vapor deposition ("CVD"), has a thermal conductivity which can approach that of natural diamond, and has been used as a heat sink material, but is expensive.

The thermal conductivity of CVD synthetic diamond varies generally in proportion to the quality thereof which, other things being equal, is generally an inverse function of the rate at which it was deposited. Synthetic diamond produced at a relatively high deposition rate will generally have a substantially lower thermal conductivity than synthetic diamond deposited at a relatively low deposition rate. This is because the synthetic diamond deposited at a higher deposition rate tends to have more structural defects which adversely affect thermal conduction. Therefore, ideally, synthetic diamond to be used as a heat sink material would be synthesized at a relatively low deposition rate in order to have the highest attainable thermal conductivity. However, this approach is problematic in that diamond synthesized at a low deposition rate will be substantially more expensive than its lower thermal conductivity counterpart synthesized at a higher deposition rate, owing to the increased time of use of expensive deposition equipment, increased power consumption, and increased feedstock material use.

It is among the objects of the present invention to maximize the effective thermal conductivity of diamond synthesized for use in thermal management of electronic components and circuits, without undue increase in expense of synthesizing the diamond material for such application.

SUMMARY OF THE INVENTION

The present invention takes advantage of the expanding thermal pattern that develops in the region near a heat-generating electronic component (which may be, without limitation a passive or active circuit element or an integrated circuit chip), and employs a limited volume of relatively expensive high thermal conductivity synthetic diamond to handle the heat near the component. Lower thermal conductivity synthetic diamond, which is relatively cheaper, can comprise the bulk of the heat sink structure, and operates sufficiently as a heat conductor in regions further away from the electronic component, where a somewhat smaller thermal conductivity has less impact on the overall efficiency of the heat sink structure.

In accordance with an embodiment of the invention, a method is set forth for forming a heat-sinked electronic component, comprising the following steps: depositing, at a first deposition rate, a first layer of synthetic diamond having a relatively high thermal conductivity; depositing, on the first layer, at a second deposition rate that is higher than the first deposition rate, a second layer of synthetic diamond having a relatively low thermal conductivity; and mounting an electronic component on the first layer of synthetic diamond. Alternatively, the layers may be deposited in the opposite order.

Preferably, the thermal conductivity of the higher thermal conductivity layer is at least fifteen percent higher than the thermal conductivity of the lower thermal conductivity layer, and the lower thermal conductivity layer is deposited to a thickness that is at least twice the thickness of the higher thermal conductivity layer. Also, preferably, the step of depositing the lower thermal conductivity layer of synthetic diamond comprises depositing the lower thermal conductivity layer at a second deposition rate that is at least fifteen percent higher than the first deposition rate.

Further features and advantages of the invention will become more readily apparent from the following detailed description when taken in conjunction with the accompanying drawings.

DETAILED DESCRIPTION

Figure 1:
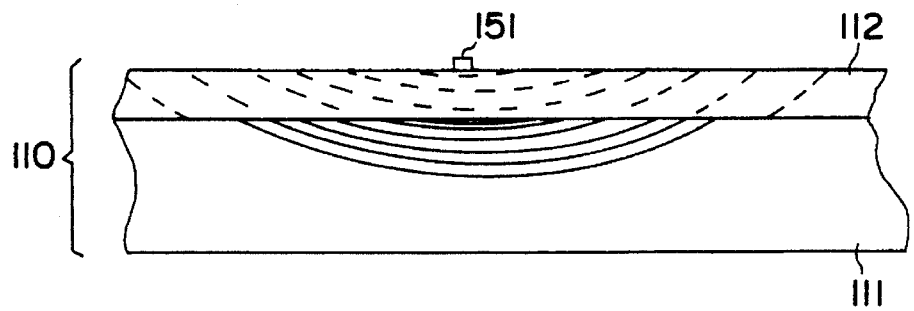
FIG. 1 is a cross-sectional schematic representation of the device of the invention which can be made using the method of the invention, and includes isotherms sketched for conceptual illustration only.

An advantage of the invention can be understood from an illustrated embodiment of a device in accordance with the invention, as shown in FIG. 1. A layered synthetic diamond structure 110 includes a relatively thick synthetic diamond layer 111, of relatively low thermal conductivity, $k_1$, and a relatively thin synthetic diamond layer 112 deposited thereon, the layer 112 having a relatively high thermal conductivity, $k_2$. For example, in FIG. 1, the layer 111 is about four times as thick as the layer 112, and the layer 111 has a thermal conductivity of about ⅔ that of the thermal conductivity of layer 112. As an example, the layers 111 and 112, in this illustration, may have respective thicknesses of 200 μm and 50 μm, and respective thermal conductivities of $k_1$=6 W/cm ° K. and $k_2$=9 W/cm ° K.

In the illustration of FIG. 1, an electronic component 151, such as a light-emitting diode device (for example, a laser diode) is coupled via leads (not shown) to an energizing source (not shown). The device, which may be only a few microns in size, dissipates power in a relatively small region and causes a "hot spot", the heat from which should preferably be carried away from the device as efficiently as possible, to promote proper operation of the device and to enhance the reliability and useful life of the device. Assume, for example, that the bottom of the lower synthetic diamond layer 111 is maintained at or near room temperature (which may or may not require active heat exchange). As illustrated in FIG. 1, isotherms (drawn at about constant temperature steps for conceptual illustration) are relatively further apart in the higher thermal conductivity diamond layer 112 (isotherms shown in dashed line) than in the relatively lower thermal conductivity diamond layer 111 (isotherms shown in dashed line). However, the temperature at the interface of the layers (which will vary laterally with respect to the position of the single heat-generating component in the illustration), where the lower layer takes on the thermal conducting load, is significantly reduced from the "hot spot" temperature at the component. Even in the layer 111, the thermal conductivity of the relatively lower quality diamond is excellent compared to most materials, and the heat is carried further away from the device with adequate efficiency. Thus, in the region of the "hot spot" where the heat has not substantially spread out, the very high thermal conductivity material is present to great advantage, whereas less expensive, and less thermally conductive, material is used to carry the remainder of the thermal management load.

Figure 2:
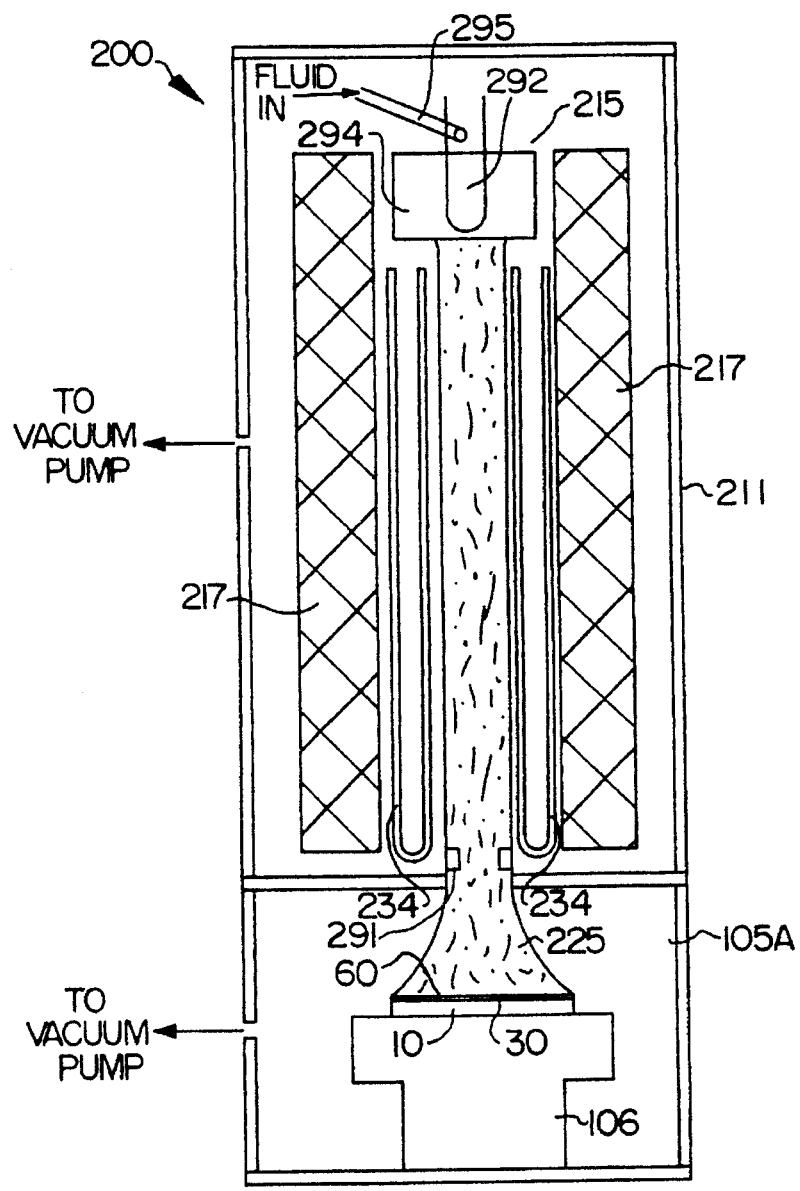
FIG. 2 is a cross-sectional schematic representation, partially in block form, of an apparatus that can be used in making the invention.

Referring to FIG. 2, there is shown a diagram of a plasma jet deposition system 200 of a type which can be utilized in practicing an embodiment of the invention. The system 200 is contained within a housing 211 and includes an arc-forming section 215 which comprises a cylindrical cathode holder 294, a rod-like cathode 292, and an injector 295 mounted adjacent the cathode so as to permit injected fluid to pass over the cathode 292. A cylindrical anode is represented at 291. In the illustrated system the input fluid may be a mixture of hydrogen and methane. The anode 291 and cathode 292 are energized by a source of electric potential (not shown), for example a DC potential. Cylindrical magnets, designated by reference numeral 217, are utilized to control the plasma generated at the arc forming section. The magnets maintain the plasma within a narrow column until the plasma reaches the deposition region 60. Optional cooling coils 234, in which a coolant can be circulated, can be located within the magnets.

In operation, a mixture of hydrogen and methane is fed to the injector 295, and a plasma is obtained in front of the arc forming section and accelerated and focused toward the deposition region. The temperature and pressure at the plasma formation region are typically in the approximate ranges 1500–15,000 degrees C and 100–700 torr, respectively, and in the deposition region are in the approximate ranges 800–1100 degrees C and 0.1–200 torr, respectively. As is known in the art, synthetic polycrystalline diamond can be formed from the described plasma, as the carbon in the methane is selectively deposited as diamond, and the graphite which forms is dissipated by combination with the hydrogen facilitating gas. For further description of plasma jet deposition systems, reference can be made to U.S. Pat. Nos. 4,471,003, 4,487,162, and 5,204,144. It will be understood that other suitable types of deposition equipment, including other types of CVD deposition equipment, can be used in conjunction with the features of the invention to be described.

The bottom portion 105A of the chamber has a base 106 on which can be mounted a substrate 10 on which the synthetic diamond is to be deposited. The base can include a temperature controller. The substrate may be, for example, molybdenum, tungsten, or graphite, with molybdenum and its alloys (such as TZM, which contains relatively small percentages of titanium and zirconium) being presently preferred. Reference can be made, for example, to copending U.S. patent application Ser. No. 973,994, now U.S. Pat. No. 5,314,652, assigned to the same assignee as the present Application, which describes considerations of roughness of the substrate with regard to appropriate holding and release of the diamond during and after deposition, and also describes the advantageous use of an interlayer (e.g. illustrated at 30 in FIG. 2), such as a titanium nitride interlayer, for coating the substrate on which the synthetic diamond is to be deposited and ultimately released.

Figure 3:
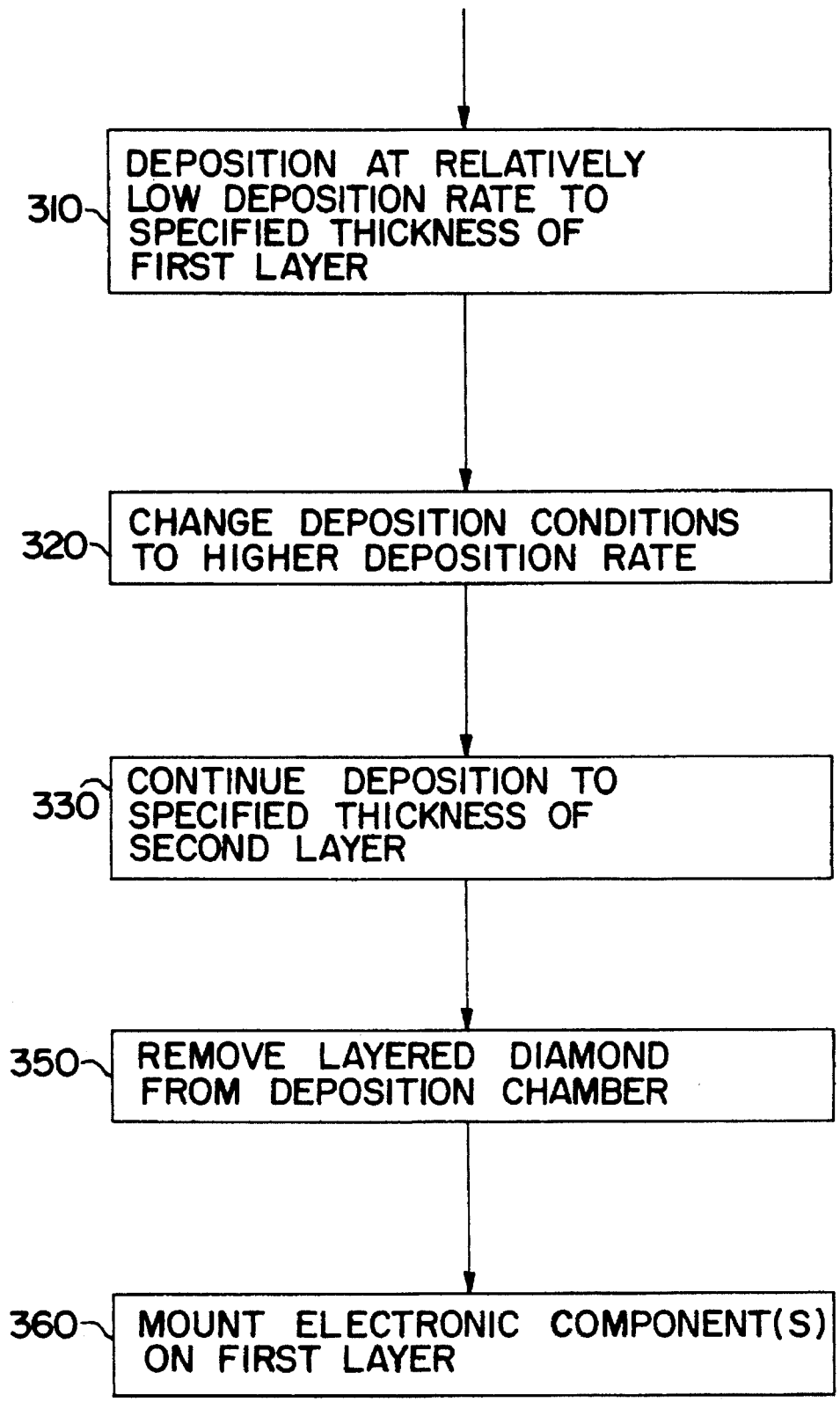
FIG. 3 is an operational flow diagram of a technique in accordance with an embodiment of the invention.

Referring to FIG. 3, there is shown an operational flow diagram of the steps of a procedure for obtaining a heat-sinked electronic component in accordance with an embodiment of the invention. The block 310 represents the deposition, at a relatively low deposition rate, of a specified thickness of diamond film, for example a thickness of about 250 μm. In an example of the present embodiment, the deposition conditions, for an equipment of the type shown in FIG. 2, which result in a deposition rate of about 12.5 μm/hr., may be, for example, as follows:

| Deposition temperature | 1050 C. |
| Enthalpy | 58 kJ/g H2 |
| Pressure | 2160 Pa |
| Methane concentration | 0.10 percent |
| Hydrogen concentration | balance |

After the desired thickness of the first layer has been deposited (in this example, after about 20 hours), the block 320 represents changing the deposition conditions to deposit a lower quality (particularly, a lower thermal conductivity) synthetic polycrystalline diamond, for example at a deposition rate of about 26 μm/hr. The deposition conditions may be, for example, the same as listed above, but with the methane concentration at 0.17 percent. Deposition under these conditions is continued (block 330), in this example, for about 26 hours, until the desired thickness is reached. In the present example, the total thickness is about 0.92 mm, of which about 0.25 mm is grown at the lower deposition rate, and about 0.67 mm is grown at the higher deposition rate. The thermal conductivity of the higher growth rate material is about 900 W/m ° K. and the thermal conductivity of the lower growth rate material is in the range 500–700 W/m ° K.

The layered diamond structure can then be released from the mandrel, such as by cooling (see above-referenced copending U.S. patent application Ser. No. 973,994), and removed from the deposition chamber, as represented by the block 350. The exterior surfaces of the structure can be lapped or polished. One or more electronic components can then be mounted on the higher thermal conductivity layer of the structure, as represented by the block 360. This can be done by any known method, for example by use of an adhesive, and with leads coupled by known lead bonding technique.

In the description just set forth, the layer of higher thermal conductivity synthetic diamond (deposited at the relatively lower deposition rate) is deposited first, but the procedure can be reversed, and the lower thermal conductivity layer (deposited at the relatively higher deposition rate) can alternatively be deposited first.

Figure 4:
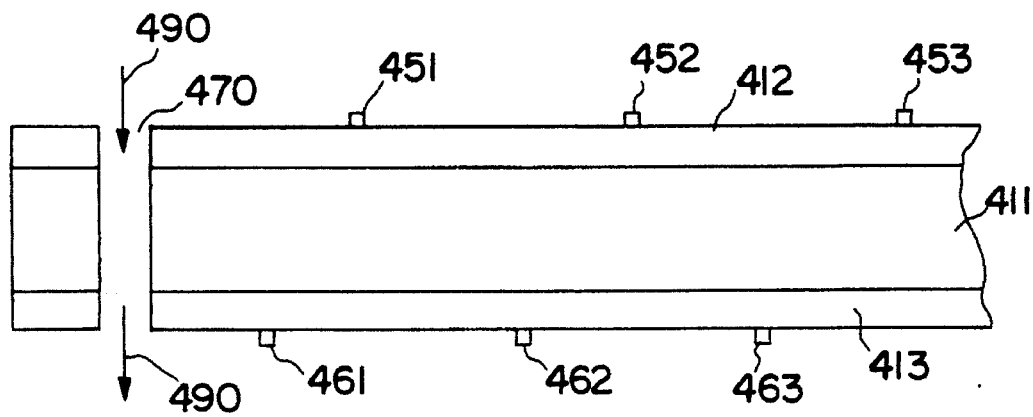
FIG. 4 is a cross-sectional representation of a heat-sinked circuit in accordance with another embodiment of the invention.

FIG. 4 illustrates a further embodiment of the invention, wherein relatively high thermal conductivity synthetic diamond layers 412 and 413 are on both sides of a relatively low thermal conductivity synthetic diamond layer 411. As above, the relatively low thermal conductivity layer is deposited at a higher deposition rate than the layers 412 and 413, and the layer 411 is substantially thicker than the layers 412 and 413. In the illustration of FIG. 4, each of the layers 412 and 413 is shown as having a plurality of electronic components mounted thereon, for example the components 451,452 and 453 on the layer 412, and the components 461, 462 and 463 on the layer 413. If desired, heat exchange fluid can be utilized to cool the diamond structure, as represented by the aperture 470 in FIG. 4, and, for example, a heat exchange liquid (represented by the arrows 490) that can pass through the aperture 470. In this regard, reference can be made to the copending U.S. patent application Ser. No. 930,482, assigned to the same assignee as the present Application. The synthetic diamond structure of FIG. 4 can be obtained, for example, by depositing, at a relatively low deposition rate, the layer 413, and then increasing the deposition rate in the manner first described above in conjunction with the operational flow diagram of FIG. 3, e.g. to obtain the layers 413 and 411. The deposition rate can then be lowered again to obtain the layer 412.

Figure 5:
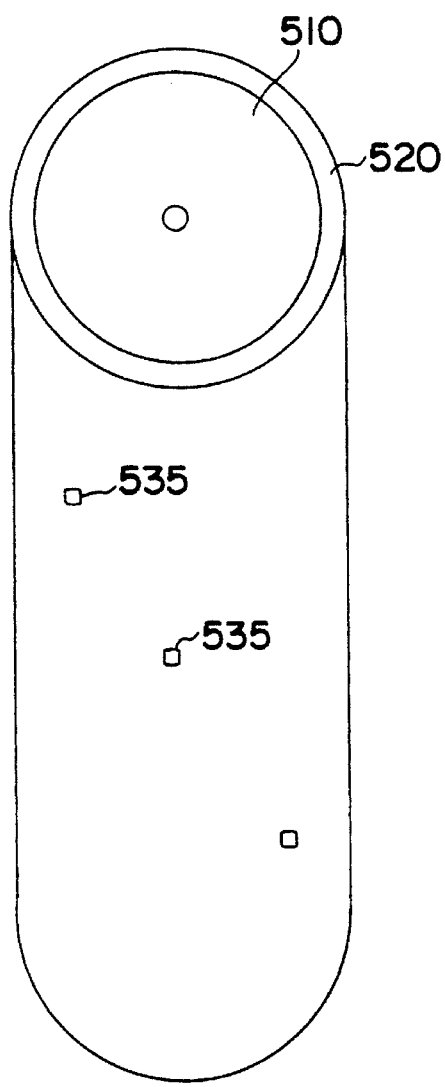
FIG. 5 illustrates a heat-sinked circuit in accordance with a further embodiment of the invention.

In the embodiments illustrated so far, the layers are planar, but they can also be curved or in other shapes, for example by deposition on a curved mandrel or substrate. Referring to FIG. 5, there is shown an embodiment of the invention wherein a first relatively thick layer 510 of relatively low thermal conductivity synthetic diamond is generally cylindrical in shape. The synthetic diamond of this embodiment can be formed, for example by deposition on a wire-type mandrel. The deposition conditions can be changed to form a relatively thin outer layer 520 of relatively high thermal conductivity. Components, such as those illustrated at 535, can be mounted on the outer layer 520.

The invention has been described with regard to particular preferred embodiments, but variations within the spirit and scope of the invention will occur to those skilled in the art. For example, the illustrated layers and technique show a sharp transition between deposition rates and resultant thermal conductivities, but, if desired, the deposition conditions could be changed gradually, whereby a transition region of any desired size will result.

I claim:

1. A method of forming a heat-sinked electronic component, comprising the steps of:

depositing, at a first deposition rate, a first layer of synthetic diamond having a first thermal conductivity;

depositing, on said first layer, at a second deposition rate that is higher than said first deposition rate, a second layer of synthetic diamond having a second thermal conductivity;

the said first thermal conductivity being at least fifteen percent higher than said second thermal conductivity; and mounting an electronic component on said first layer of synthetic diamond.

2. The method as defined by claim 1, wherein said second layer is deposited to a thickness that is at least twice the thickness of said first layer.

3. The method as defined by claim 1, wherein said second deposition rate is at least fifteen percent higher than said first deposition rate.

4. The method as defined by claim 2, wherein said second deposition rate is at least fifteen percent higher than said first deposition rate.

5. The method as defined by claim 1, wherein said first and second depositing steps are performed using chemical vapor deposition using, a carbonaceous gas and hydrogen.

6. The method as defined by claim 2, wherein said first and second depositing steps are performed using chemical vapor deposition using a carbonaceous gas and hydrogen.

7. The method as defined by claim 3, wherein said first and second depositing steps are performed using chemical vapor deposition using a carbonaceous gas and hydrogen.

8. The method as defined by claim 7, wherein the ratio of carbonaceous gas to hydrogen is higher during deposition of said second layer than during deposition of said first layer.

9. The method as defined by claim 2, wherein said step of mounting an electronic component on said first layer of synthetic diamond comprises mounting of plurality of electronic components on said first layer.

10. A method of producing a heat-sinked electronic component, comprising the steps of:

depositing adjacent layers of synthetic diamond having substantially different thermal conductivities, by depositing one of said layers at a first deposition rate to obtain synthetic diamond having a first thermal conductivity, and depositing the other of said layers at a second deposition rate to obtain synthetic diamond having a second thermal conductivity;

said first deposition rate being higher than said second deposition rate, and said second thermal conductivity being at least fifteen percent higher than said first thermal conductivity; and mounting said electronic component on said other of said layers.

11. The method as defined by claim 10, wherein said other of said layers is deposited on said one of said layers.

12. The method as defined by claim 10, wherein said one of said layers is deposited on said other of said layers.

13. The method as defined by claim 10, wherein said one of said layers is deposited to a thickness that is at least twice the thickness of said other of said layers.

14. The method as defined by claim 11, wherein said one of said layers is deposited to a thickness that is at least twice the thickness of said other of said layers.

15. The method as defined by claim 10, wherein said first deposition rate is at least fifteen percent higher than said second deposition rate.

16. The method as defined by claim 13, wherein said first deposition rate is at least fifteen percent higher than said second deposition rate.

17. The method as defined by claim 12, wherein said one of said layers is deposited to a thickness that is at least twice the thickness of said other of said layers.

* * * * *